United States Patent
Li et al.

(10) Patent No.: US 12,250,776 B2
(45) Date of Patent: Mar. 11, 2025

(54) SUBSTRATE STRUCTURE AND CUTTING METHOD THEREOF

(71) Applicant: UNIMICRON TECHNOLOGY CORP., Taoyuan (TW)

(72) Inventors: Jeng-Ting Li, Taoyuan (TW); Chi-Hai Kuo, Taoyuan (TW); Cheng-Ta Ko, Taoyuan (TW); Pu-Ju Lin, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 17 days.

(21) Appl. No.: 18/317,756

(22) Filed: May 15, 2023

(65) Prior Publication Data

US 2024/0357748 A1    Oct. 24, 2024

(30) Foreign Application Priority Data

Apr. 21, 2023   (TW) .................................. 112114941

(51) Int. Cl.
*H05K 3/00* (2006.01)
*C03C 15/00* (2006.01)
*C03C 23/00* (2006.01)
*H05K 1/03* (2006.01)

(52) U.S. Cl.
CPC ............. *H05K 3/002* (2013.01); *C03C 15/00* (2013.01); *C03C 23/0025* (2013.01); *H05K 1/0306* (2013.01); *H05K 2203/107* (2013.01)

(58) Field of Classification Search
CPC ................. H05K 3/002; H05K 1/0306; H05K 2203/107; C03C 15/00; C03C 23/0025
USPC ....................................................... 216/65, 94
See application file for complete search history.

(56) References Cited

U.S. PATENT DOCUMENTS

2019/0088603 A1*  3/2019  Marimuthu ............. H01L 24/20

FOREIGN PATENT DOCUMENTS

| CN | 102097337 B | 8/2015 | |
|---|---|---|---|
| EP | 3984970 A1 * | 4/2022 | ......... B81C 1/00539 |
| TW | I678342 B | 12/2019 | |
| TW | I714921 B | 1/2021 | |
| TW | 202146959 A | 12/2021 | |
| TW | 202221782 A | 6/2022 | |
| TW | I779039 B | 10/2022 | |

OTHER PUBLICATIONS

Translation of WO2020241805A1 (Year: 2020).*

* cited by examiner

*Primary Examiner* — Duy Vu N Deo
(74) *Attorney, Agent, or Firm* — Birch, Stewart, Kolasch & Birch, LLP (57) ABSTRACT

A substrate structure and a cutting method thereof are provided. The cutting method includes the following steps. A first substrate structure is provided, wherein the first substrate structure includes a glass substrate and a redistribution layer disposed on the glass substrate. A laser process is performed on the glass substrate to form a modified region on the glass substrate. A wet etching process is performed on the modified region of the glass substrate to remove the modified region and form a plurality of second substrate structures.

13 Claims, 9 Drawing Sheets

SUBSTRATE STRUCTURE AND CUTTING METHOD THEREOF

CROSS REFERENCE TO RELATED APPLICATIONS

This application claims priority of Taiwan Patent Application No. 112114941, filed on Apr. 21, 2023, the entirety of which is incorporated by reference herein.

BACKGROUND OF THE INVENTION

Field of the Invention

The present disclosure is related to a substrate structure and a cutting method thereof, and, in particular, it is related to a substrate structure with a scribed surface having an arc profile and a cutting method thereof.

Description of the Related Art

Glass can be used as a carrier element in electronic devices, such as a substrate in a printed circuit board (PCB) or an interposer in a 2.5D package. However, glass is a hard and brittle material, and is prone to cracking due to stress or collision during the manufacturing process, thereby failing in its function as a carrier element. Therefore, although existing glass-based substrate structures have generally met their intended purposes, they are not entirely satisfactory in every respect. Therefore, there is still a need to develop new substrate structures and cutting techniques.

BRIEF SUMMARY OF THE INVENTION

A cutting method for a substrate structure is provided. The cutting method includes the following steps. A first substrate structure is provided, wherein the first substrate structure includes a glass substrate and a redistribution layer disposed on the glass substrate. A laser process is performed on the glass substrate to form a modified region on the glass substrate. A wet etching process is performed on the modified region of the glass substrate to remove the modified region and form a plurality of second substrate structures.

In some embodiments, the laser process includes the following step. The glass substrate is irradiated with picosecond infrared light or femtosecond infrared light to form the modified region.

In some embodiments, the laser process includes the following step. Along a scribe line of the glass substrate, the glass substrate is intermittently irradiated with a plurality of laser light spots having a first diameter.

In some embodiments, the step of performing the laser process on the glass substrate includes the following operation. Along the thickness direction of the glass substrate, the glass substrate is intermittently irradiated with a plurality of laser light spots having a first diameter from the bottom surface of the glass substrate to the top surface of the glass substrate.

In some embodiments, the dot central interval of the plurality of laser light spots is about ⅔ of the first diameter.

In some embodiments, the step of performing the laser process on the glass substrate includes the following operations. Along the thickness direction of the glass substrate, the glass substrate is intermittently irradiated with a plurality of first laser light spots having a first diameter from the bottom surface of the glass substrate to the top surface of the glass substrate until an intermediate level. Then along the thickness direction of the glass substrate, the glass substrate is intermittently irradiated with a plurality of second laser light spots having a second diameter from the intermediate level to the top surface of the glass substrate, wherein the second diameter is different from the first diameter.

In some embodiments, the vertical distance between the intermediate level and the bottom surface is ⅓ of the thickness of the glass substrate.

In some embodiments, the first diameter is ½ of the second diameter.

In some embodiments, the dot central interval of the first laser light spots is about ⅔ of the first diameter; and/or the dot central interval of the second laser light spots is about ½ of the second diameter.

In some embodiments, the step of performing the laser process on the glass substrate includes the following operations. Along the thickness direction of the glass substrate, the glass substrate is intermittently irradiated with a plurality of first laser light spots having a first diameter from the bottom surface of the glass substrate to the top surface of the glass substrate. Along the thickness direction of the glass substrate, the glass substrate is intermittently irradiated with a plurality of second laser light spots having a second diameter from an intermediate level of the glass substrate to the top surface of the glass substrate. The second laser light spots are located on at least one side of the first laser light spots.

In some embodiments, the vertical distance between the intermediate level and the bottom surface is ½ of the thickness of the glass substrate.

In some embodiments, the first diameter is the same as the second diameter.

In some embodiments, the second laser light spots are located on opposite sides of the first laser light spots.

In some embodiments, the wet etching process includes the following step. An etchant is applied to the modified region of the glass substrate, wherein the etchant includes hydrofluoric acid (HF) and/or fluorine amines ($NH_4F$).

In some embodiments, before performing the laser process on the glass substrate, the cutting method for the substrate structure further includes the following step. A protection layer is disposed to cover the glass substrate and the redistribution layer. The step of performing the laser process on the glass substrate further includes the following operation. Using a laser process, part of the protection layer is removed to expose a part of the glass substrate, and the modified region is formed on that part of the glass substrate. After performing the wet etching process on the modified region of the glass substrate, the cutting method for the substrate structure further includes removing the protection layer.

A substrate structure is provided. The substrate structure includes a glass substrate and a redistribution layer. The glass substrate has a top surface, a bottom surface, and a scribed surface between the top surface and the bottom surface, wherein the light transmittance of the scribed surface is lower than the light transmittance of either the top surface or the bottom surface. The redistribution layer is disposed on the glass substrate, wherein the scribed surface has an arc profile, and the scribed surface protrudes outward from the middle of the glass substrate.

In some embodiments, the arc profile is a full bullnose or a half bullnose.

In some embodiments, the scribed surface further has at least one stepped portion, and the at least one stepped portion protrudes outward from the middle of the glass substrate.

In some embodiments, the glass substrate further has a notch adjacent to the scribed surface, and the light transmittance of the sidewall of the notch is lower than the light transmittance of either the top surface or the bottom surface.

In some embodiments, the depth of the notch is ⅓ of the thickness of the glass substrate.

The substrate structure disclosed herein can be applied in various types of electronic devices. In order to make the features and advantages of the present disclosure more comprehensible, various embodiments are specially cited below, together with the accompanying drawings, to be described in detail as follows.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

The following disclosure provides many different embodiments, or examples, for implementing different features of the provided neutron beam source generation system, neutron beam source stabilization control system, and neutron beam source generation method. Specific examples of features and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The directional terms mentioned herein, such as "up", "down", "left", "right", and similar terms refer to the directions of the drawings. Accordingly, the directional terms used is to illustrate, not to limit, the present disclosure.

In some embodiments of the present disclosure, terms about disposing and connecting, such as "disposing", "connecting" and similar terms, unless otherwise specified, may refer to two features are in direct contact with each other, or may also refer to two features are not in direct contact with each other, wherein there is an additional connect feature between the two features. The terms about disposing and connecting may also include the case where both features are movable, or both features are fixed.

In addition, ordinal numbers such as "first", "second", and the like used in the specification and claims are configured to modify different features or to distinguish different embodiments or ranges, rather than to limit the number, the upper or lower limits of features, and are not intended to limit the order of manufacture or arrangement of features.

The terms "about", "substantially", or the like used herein generally means within 10%, within 5%, within 3%, within 2%, within 1%, or within 0.5% of a given value or a given range. The value given herein is an approximate value, that is, the meaning of "about" may still be implied without the specific description of "about".

Unless otherwise defined, all terms (including technical and scientific terms) used herein have the same meaning as commonly understood by one of ordinary skill in the art. It should be understood that these terms, such as those defined in commonly used dictionaries, should be interpreted as having meanings consistent with the background or context of the related technology and the present disclosure, and should not be interpreted in an idealized or overly formal manner, unless otherwise specified in the embodiments of the present disclosure.

Some variations of the embodiments are described below. In different figures and described embodiments, the same or similar reference numerals are configured to refer to the same or similar features. It should be understood that additional steps may be provided before, during, and after the method, and that some described steps may be replaced or deleted for another embodiment of the method. It should be understood that, in the following embodiments without departing from the spirit of the present disclosure, features in different embodiments may be replaced, reorganized, and combined to form another embodiment. As long as the features in the various embodiments do not violate the spirit of the invention or conflict, they may be used in any combination.

In some existing substrate structures, in order to improve production efficiency and reduce costs, the following steps are performed. Generally, one or more processes are performed on a large-area glass substrate to form a patterned redistribution layer, and then the glass substrate is divided using a wheel knife or a laser, thereby forming multiple substrate structures at one time. However, the above-mentioned cutting method tends to generate excessive stress at the edges of the glass substrate, and it may cause chipping and cracking at the edge of the glass due to collisions during the process. Therefore, in order to avoid further damage to the glass substrate during subsequent manufacturing or transportation, it is usually necessary to perform an edge grinding process on the cut glass substrate, so as to eliminate or avoid the possible defects mentioned above. In other words, cutting the glass substrate physically or by laser is not only prone to unintended defects, but it also increases the complexity of the entire manufacturing process, resulting in high costs that cannot be ignored.

Therefore, the present disclosure provides a substrate structure and a cutting method thereof, in which the glass substrate is modified by a laser process, so that different regions of the glass substrate have etching selectivity. In this way, the wet etching process may be used to cutting the glass substrate, thereby effectively reducing possible defects (such as cracks) of the glass substrate. The formation of the substrate structure and possible variations will be described in detail below to make the present disclosure clearer and easier to understand.

Referring to FIGS. 1A to 1C, 2A to 2C, 3A to 3C, and 4A to 4C. FIGS. 1A, 2A, 3A, and 4A are schematic diagrams illustrating the substrate structure at different formation stages according to some embodiments of the present disclosure. FIGS. 1B, 2B, 3B, and 4B are cross-sectional views illustrating the substrate structure at different formation stages according to some embodiments of the present disclosure. FIGS. 1C, 2C, 3C, and 4C are top views illustrating the substrate structure at different formation stages according to some embodiments of the present disclosure.

Figure 1A:
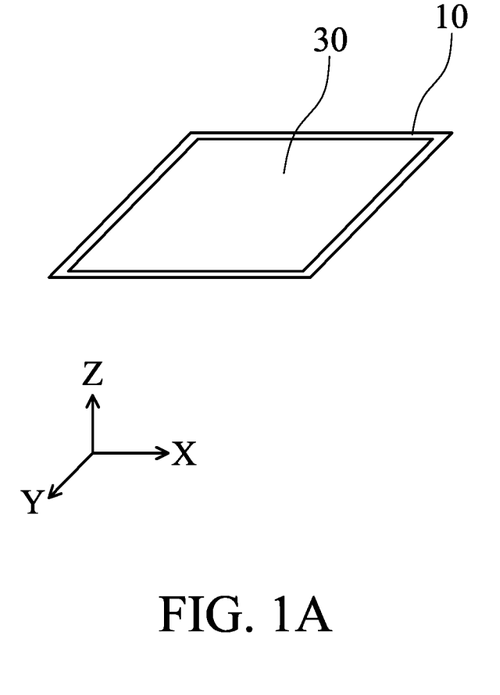
FIGS. 1A, 2A, 3A, and 4A are schematic diagrams illustrating the substrate structure at different formation stages according to some embodiments of the present disclosure.
Figure 1B:
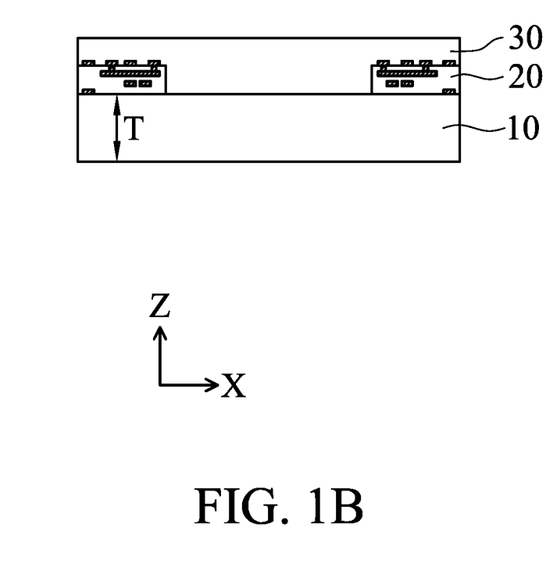
FIGS. 1B, 2B, 3B, and 4B are cross-sectional views illustrating the substrate structure at different formation stages according to some embodiments of the present disclosure.
Figure 1C:
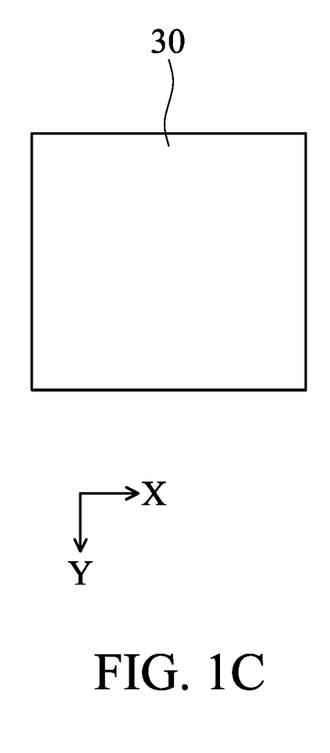
FIGS. 1C, 2C, 3C, and 4C are top views illustrating the substrate structure at different formation stages according to some embodiments of the present disclosure.

Referring to the schematic diagram, cross-sectional view, and top view shown in FIG. 1A to FIG. 1C. A first substrate structure is provided, wherein the first substrate structure includes a glass substrate 10 and a redistribution layer 20 disposed on the glass substrate. In some embodiments, the glass substrate 10 may be or include phospho silicate glass (PSG), boro silicate glass (BSG), boron-doped phospho silicate glass (BPSG), fluorine-doped silicate glass (FSG), silicon oxide, a combination thereof, or other suitable materials, but the present disclosure is not limited thereto. In some embodiments, the thickness T of the glass substrate 10 may be between 0.4 mm and 1.8 mm, but the present disclosure is not limited thereto. For example, the thickness T of the glass substrate 10 may be 0.4 mm, 0.8 mm, 1.1 mm, 1.8 mm or any range between the above values. When the thickness T of the glass substrate 10 is greater than 1.8 mm, subsequent processes for cutting the glass substrate 10 (for example, laser process and/or wet etching process) may be unfavorable. Conversely, when the thickness T of the glass substrate 10 is less than 0.4 mm, it may be detrimental to its function as a carrier element.

In some embodiments, the redistribution layer 20 may include conductive materials and insulating layers. For example, the conductive material may be aluminum (Al), copper (Cu), gold (Au), silver (Ag), alloys thereof, or their compounds, and the insulating layer may be Ajinomoto build-up film (ABF), Polyimide (PI), photoimageable dielectric (PID), or polypropylene (PP), but the present disclosure is not limited thereto. In some embodiments, the redistribution layer 20 may be a single-layer structure or a multi-layer structure.

In some embodiments, the first substrate structure may further include a protection layer 30. For example, the protection layer 30 may be disposed to cover the glass substrate 10 and the redistribution layer 20 by a deposition process, a coating process, or other suitable processes, but the present disclosure is not limited thereto. The protective layer 30 may be used to prevent the redistribution layer 20 from unexpected damage in the subsequent wet etching process. In some embodiments, the protective layer 30 may be or include polypropylene (PP), polyvinylpyrrolidone (PVP), polyethylene terephthalate (PET), methyl methacrylate (PMMA), polyvinyl chloride resin (PVC), a combination thereof, or other suitable materials, but the present disclosure is not limited thereto. In some embodiments in which hydrofluoric acid (HF) and/or fluorine amines ($NH_4F$) are used as the etchant for the subsequent wet etching process, the protective layer 30 may include materials with high corrosion resistance to acidic substances such as fluorine amines ($NH_4F$). Alternatively, a protective layer 30 with sufficient thickness may also be provided to protect the redistribution layer 20 before the wet etching process of the glass substrate 10 is completed.

Figure 2A:
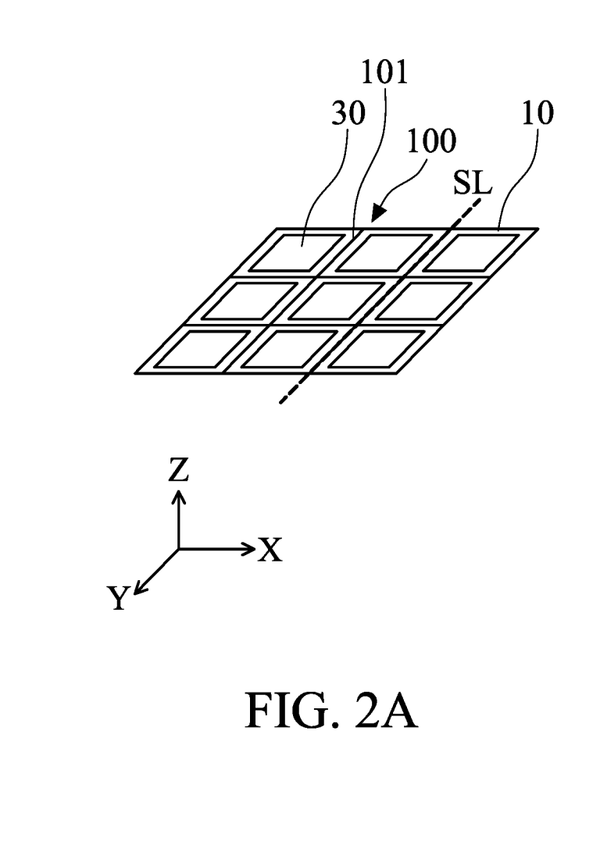
Figure 2B:
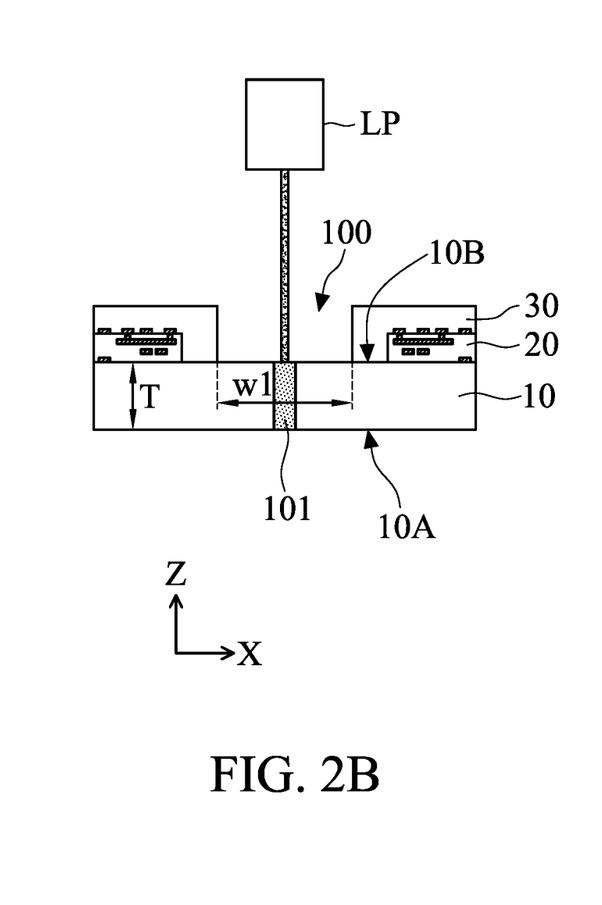
Figure 2C:
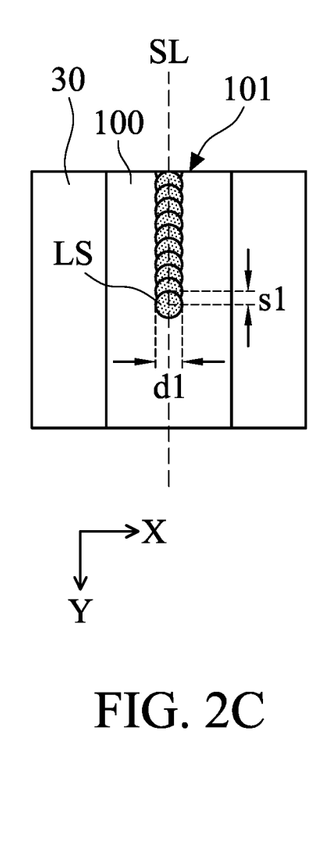

Referring to the schematic diagram, cross-sectional view, and, top view shown in FIGS. 2A to 2C. In some embodiments, a laser processing process LP is performed on the glass substrate 10. The laser process LP first removes a part of the protective layer 30 to form an opening 100, wherein the opening 100 exposes part of the glass substrate 10, and then the laser process forms a modified region 101 on that part of the glass substrate 10. The term "modify" used herein refers to irradiating the glass substrate 10 with a high-energy beam (that is, laser) so as to "make the irradiated glass substrate 10 decayed". Microscopically, the crystal lattice of the irradiated glass substrate may be poorly aligned (that is, the order degree decreases). In this way, compared with non-irradiated glass substrates, the irradiated glass substrates are more susceptible to corrosion by corrosive substances (for example, etchant), thus having relatively higher etching selectivity. Hereinafter, the irradiated region of the glass substrate 10 is referred to as "modified region 101".

In some embodiments, the laser operation for removing the protective layer 30 includes the following operation. The glass substrate 10 is irradiated with infrared light, ultraviolet light, or other suitable lasers, so as to remove the protective layer 30 and expose a part of the glass substrate. For example, the infrared light may be or include picosecond infrared light, femtosecond infrared light, a combination thereof, or other suitable infrared light, but the present disclosure is not limited thereto. In some embodiments, the intensity of the laser may be between 10 W and 50 W, but the present disclosure is not limited thereto. For example, the intensity of the laser may be 10 W, 20 W, 40 W, 50 W, or any range between the above values. When the laser intensity is higher than 50 W, unexpected damage may be caused to the glass substrate 10 around the modified region 101. Conversely, when the laser intensity is lower than 10 W, the protection layer 30 to be removed may not be completely removed, resulting in unexpected residues.

In some embodiments, the opening 100 of the protective layer 30 has a first width w1. In some embodiments, the first width w1 may be between 0.1 mm and 2.5 mm, but the present disclosure is not limited thereto. For example, the first width w1 may be 0.15 mm, 0.5 mm, 1 mm, 1.5 mm, 2.5 mm, or any range between the above values. When the first width w1 is less than 0.1 mm, the process margin of the subsequent laser operation for forming the modified region will be low. Conversely, when the first width w1 is larger than 2.5 mm, the protective layer may not completely cover the entire conductive layer, so it is difficult to protect the conductive layer from the subsequent wet etching process.

After the opening 100 is formed, in some embodiments, the laser operation for forming the modified region 101 includes the following operation. The glass substrate 10 is irradiated with infrared light, ultraviolet light, or other suitable lasers to form the modified region 101 on the glass substrate 10. For example, the infrared light may be or include picosecond infrared light, femtosecond infrared light, a combination thereof, or other suitable infrared light, but the present disclosure is not limited thereto. In some embodiments, the intensity of the laser may be between 10 W and 50 W, but the present disclosure is not limited thereto. For example, the intensity of the laser may be 10 W, 20 W, 40 W, 50 W or any range between the above values. When the laser intensity is higher than 50 W, unexpected damage may be caused to the glass substrate 10 around the modified region 101. Conversely, when the laser intensity is lower than 10 W, it may not be possible to produce an expected etching selectivity between the irradiated region (that is, the modified region 101) and the non-irradiated region of the glass substrate 10.

In some embodiments, the etching selectivity of the irradiated region (that is, the modified region 101) to the non-irradiated region of the glass substrate 10 may be between 5:1 and 10:1, but the present disclosure is not limited to this. For example, the etching selectivity of the irradiated region to the non-irradiated region may be 5:1, 6:1, 8:1, 10:1, or any range between the above values. It should be noted that the above-mentioned numerical values are only examples, and a person having ordinary skill in the art may select etching selectivity according to various conditions, such as the type of laser, the intensity of the laser, the material, the thickness T, the shape of the glass substrate 10, the scribed surface to be formed, the etchant type, and other conditions. For example, when the laser intensity is higher or the wavelength used is shorter (for example, ultraviolet light), the resulting etching selectivity is greater. Conversely, when the laser intensity is smaller or the wavelength used (for example, infrared light) is longer, the resulting etching selection is smaller. Therefore, the etching selectivity may be obtained according to the intensity of the laser, the type of laser, and the like.

In some embodiments, the laser operation for forming the modified region further includes the following operation. Along a scribe line SL of the glass substrate, the portion of the glass substrate exposed by the opening 100 is intermittently irradiated a plurality of laser light spots LS having a first diameter d1. The term "intermittent" used herein refers to irradiating the laser light spots LS on the glass substrate in stages at specific intervals, rather than continuously irradiating the glass substrate along the scribe line SL with a single and continuous laser beam.

In some embodiments, the first diameter d1 of the laser light spots LS may be between 1 μm and 10 μm, but the present disclosure is not limited thereto. For example, the first diameter d1 may be 2.5 μm, 5 μm, 7.5 μm, or any range between the above values. In some embodiments, the dot central interval s1 between two adjacent laser light spots LS may be between 1 μm and 10 μm, but the present disclosure is not limited thereto. For example, the dot central interval s1 may be 1.25 μm, 2.5 μm, 3.75 μm, or any range between the above values. In some embodiments, the dot central interval s1 may be about ½ of the first diameter d1, so that two adjacent laser light spots LS partially overlap to form a continuous modified region 101. However, the above numerical values are just examples, and the present disclosure is not limited thereto. In some embodiments, two adjacent laser light spots LS may have a larger or smaller overlapping range. For example, the dot central interval s1 may be about ¼, ¾, or other suitable values of the first diameter d1. In some embodiments, two adjacent laser light spots LS may also be in contact with each other but not overlap.

In some embodiments, the parameters (for example, intensity, type, and radius of the laser light spots) used in the laser operation for forming the modified region 101 may be similar or the same as the parameters used in the laser operation for removing the protective layer 30, but the present disclosure is not limited thereto. For example, the part of the protective layer 30 may be removed by using laser light spots LS with a relatively high-energy and/or large diameter first, and then the modified region 101 may be formed by using laser light spots LS with a relatively low-energy and/or small diameter.

In some embodiments, the modified region 101 extends from the bottom surface 10A of the glass substrate 10 to the top surface 10B of the glass substrate 10. In other words, the thickness of the modified region 101 is the same as the thickness T of the glass substrate 10. In this way, when the modified region 101 is completely removed, the glass substrate 10 will be broken and at least two glass substrates 10 will be formed.

Figure 3A:
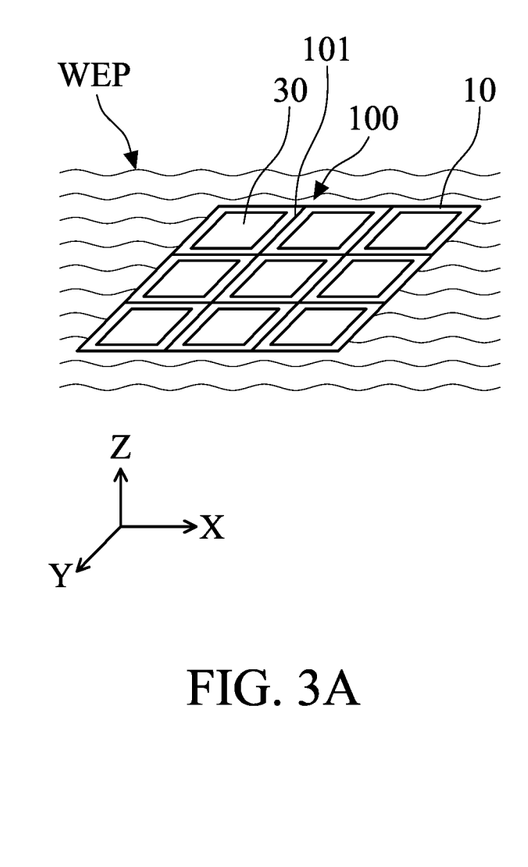
Figure 3B:
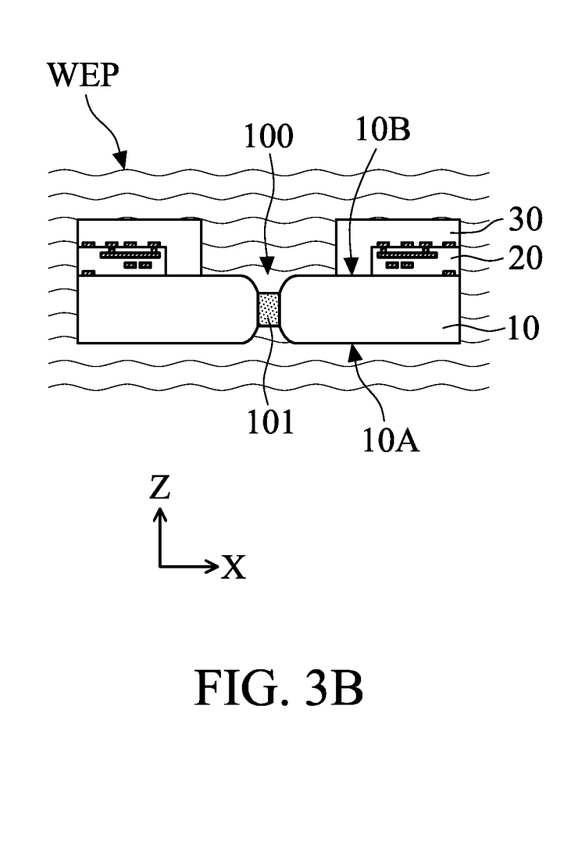
Figure 3C:
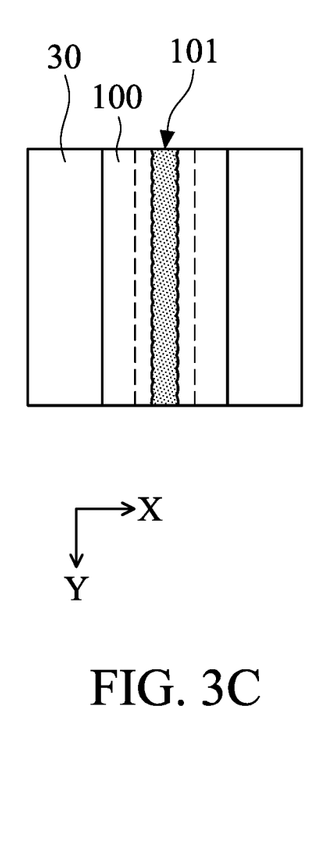

Referring to the schematic diagram, cross-sectional view, and top view shown in FIGS. 3A to 3C. In some embodiments, a wet etching process WEP is performed on the modified region 101 of the glass substrate 10. The wet etching process WEP includes soaking the modified region 101 of the glass substrate 10 or the entire glass substrate 10 in an etchant. In some embodiments, the etchant may be or include hydrofluoric acid (HF), fluorine amines ($NH_4F$), a combination thereof, or other suitable materials, but the present disclosure is not limited thereto. Due to the etching selectivity of the modified region 101 to the non-irradiated region of the glass substrate 10, the modified region 101 may be removed after soaking the glass substrate 10 in the etchant for a period of time.

It should be noted that even though the non-irradiated region of the glass substrate 10 has higher corrosion resistance to the etchant than the modified region 101, the non-irradiated region is still attacked by the etchant and thus removed in a small amount. As shown in FIG. 3B, when the entire glass substrate 10 is soaked in the etchant, the position where the top surface 10B of the glass substrate 10 intersects with the modified region 101 is gradually recessed due to the long-term soaking in the etchant to form a rounded corner. Similarly, the position where the bottom surface 10A of the glass substrate 10 intersects with the modified region 101 is also gradually recessed to form a rounded corner.

Figure 4A:
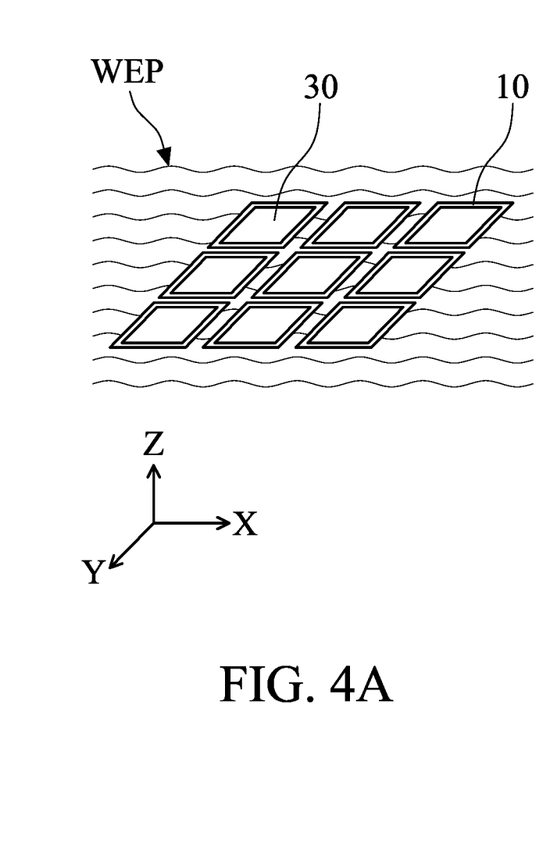
Figure 4B:
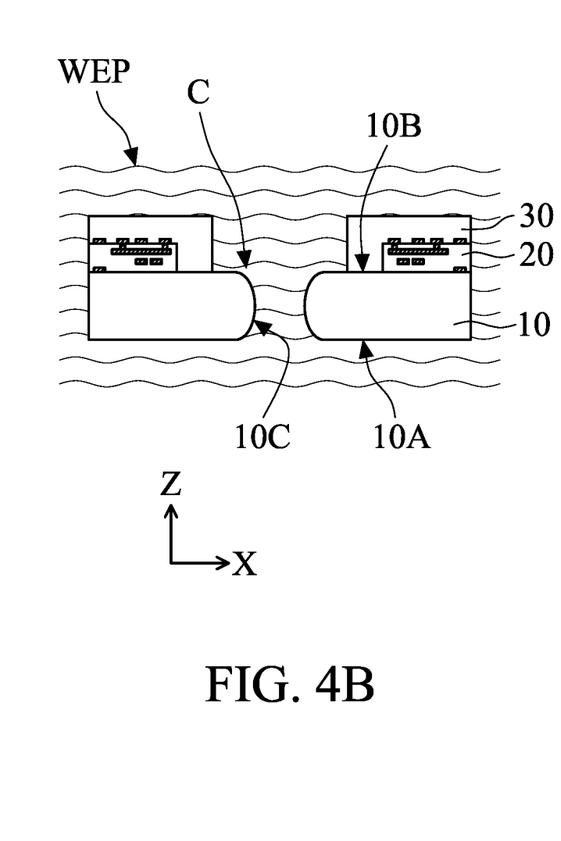
Figure 4C:
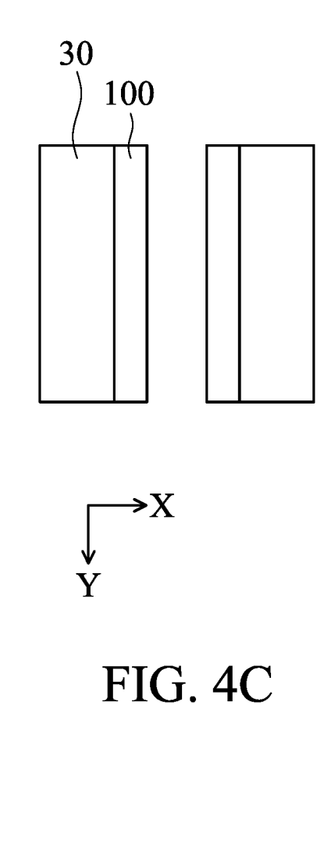

Referring to the schematic diagram, cross-sectional view, and top view shown in FIGS. 4A to 4C. In some embodiments, the wet etching process WEP is performed until the modified region 101 is completely removed, so that the glass substrate 10 is disconnected along the original modified region 101 and forms a plurality of glass substrates 10. The sidewall between the glass substrate 10 and the original modified region 101 may be referred to as a scribed surface 10C. Following the above process, in some embodiments, the protection layer 30 is removed. In some embodiments, the broken glass substrate 10 and the redistribution layer 20 thereon may be referred to as a second substrate structure.

Specifically, at least one of the sidewalls of the second substrate structure formed by the above process is the scribed surface 10C, and the scribed surface 10C is located between the top surface 10B and the bottom surface 10A. Since the etchant has the longest etching time for the position of the scribed surface 10C adjacent to the top surface 10B and/or the bottom surface 10A, the position of the scribed surface 10C adjacent to the top surface 10B and/or the bottom surface 10A is obviously recessed. Therefore, the scribed surface 10C may have a circular arc profile C, and the scribed surface 10C protrudes outward from the middle of the glass substrate 10. Through the above process, the present disclosure may make the cut glass substrate 10 naturally have a shape similar to that after the edge grinding process, without the need for an additional edge grinding process.

It should be noted that the part that is in contact with the etchant of the glass substrate 10 of the second substrate structure, which is formed by the above-mentioned cutting method, forms an island-like microstructure due to it being soaked in the etchant. The light transmittance of the island-like microstructure is lower than that of the original microstructure, and presents a foggy visual effect. In other words, the light transmittance of the scribed surface 10C is lower than at least the light transmittance of the top surface 10B once covered by the protective layer 30 and the light transmittance of the bottom surface 10A once covered by the protective layer 30. In some embodiments, the transmittance of the glass substrate 10 not exposed to the etchant is >90%, while the transmittance of the glass substrate 10 exposed to the etchant (for example, the scribed surface 10C) is 60% to 90%, but the present disclosure is not limited thereto. In some embodiments, the ratio of the transmittance of the glass substrate 10 not exposed to the etchant to the transmittance of the glass substrate 10 exposed to the etchant (for example, the scribed surface 10C) may be between 3:2 and 1:1, but the present disclosure is not limited thereto.

Figure 5A:
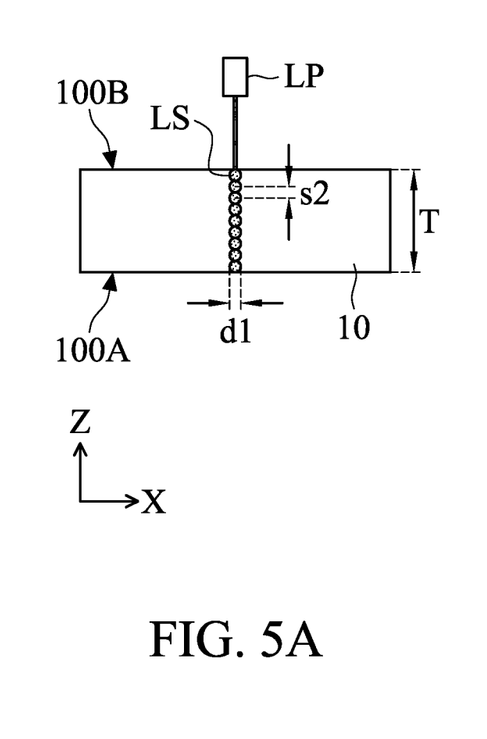
FIGS. 5A to 5C are cross-sectional views illustrating the substrate structure at different formation stages according to another embodiment of the present disclosure.
Figure 5B:
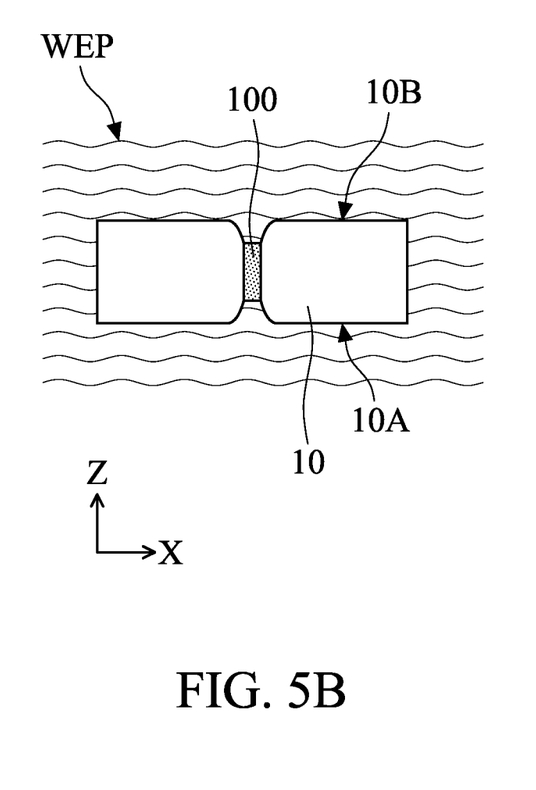
Figure 5C:
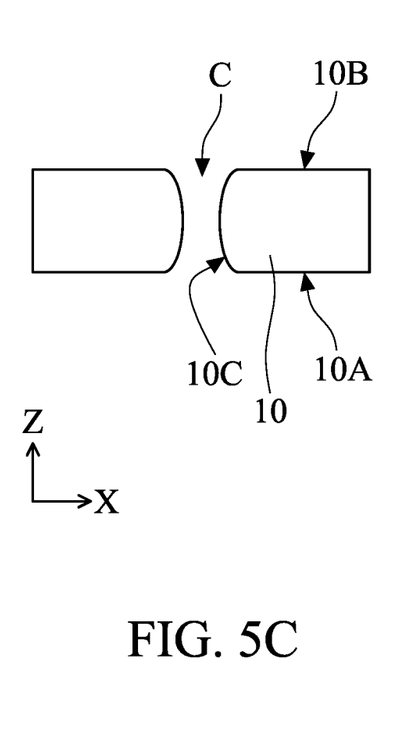

Referring to FIGS. 5A to 5C, they are cross-sectional views of the substrate structure in different formation stages according to another embodiment of the present disclosure. For ease of understanding, the redistribution layer 20 and the protection layer 30 are omitted in these figures. As shown in FIG. 5A, in some embodiments, the step of performing the laser process LP on the glass substrate 10 further includes the following operation. Along the thickness direction (that is, the Z direction) of the glass substrate 10, the glass substrate 10 is intermittently irradiated with a plurality of laser light spots LS having a first diameter d1 from the bottom surface 10A of the glass substrate 10 to the top surface 10B of the glass substrate 10. In other words, in the present disclosure, in addition to making the trajectories of the plurality of laser light spots LS on the XY plane overlap to form a continuous modified region 101 in the Y direction, it may also make the trajectories of the plurality of laser light spots LS on the XZ plane overlap to form a continuous modified region 101 in the Z direction.

In some embodiments, the first diameter d1 of the laser light spots LS may be between 1 μm and 10 μm, such as 5 μm. In some embodiments, the dot central interval s2 of two adjacent laser light spots LS may be between 1 μm and 10 μm, such as 2.5 μm. In some embodiments, the dot central interval s2 may be about ½ of the first diameter d1, or two adjacent laser light spots LS may be in contact with each other but not overlap.

As shown in FIG. 5B, the modified region 101 formed by the above steps will produce similar recesses at the positions adjacent to the top surface 10B and the bottom surface 10A both. Therefore, as shown in FIG. 5C, the finally formed scribed surface 10C has a circular arc profile C, and the circular arc profile C is a full bullnose.

Figure 6A:
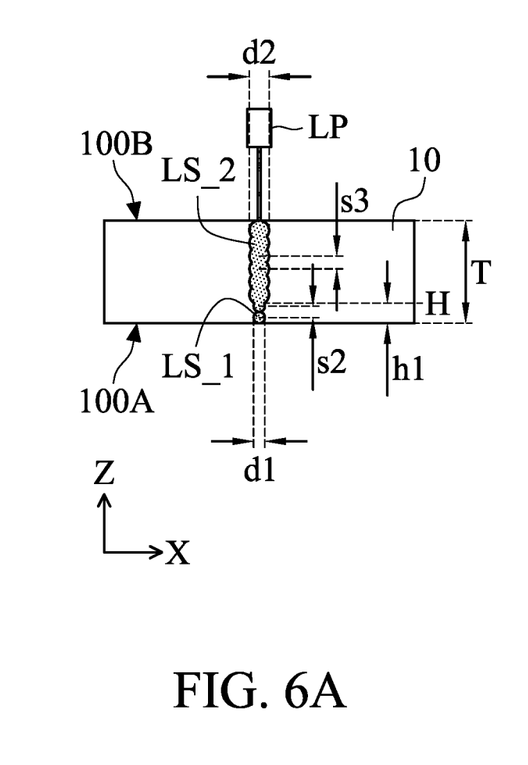
FIGS. 6A to 6C are cross-sectional views illustrating the substrate structure at different formation stages according to another embodiment of the present disclosure.
Figure 6B:
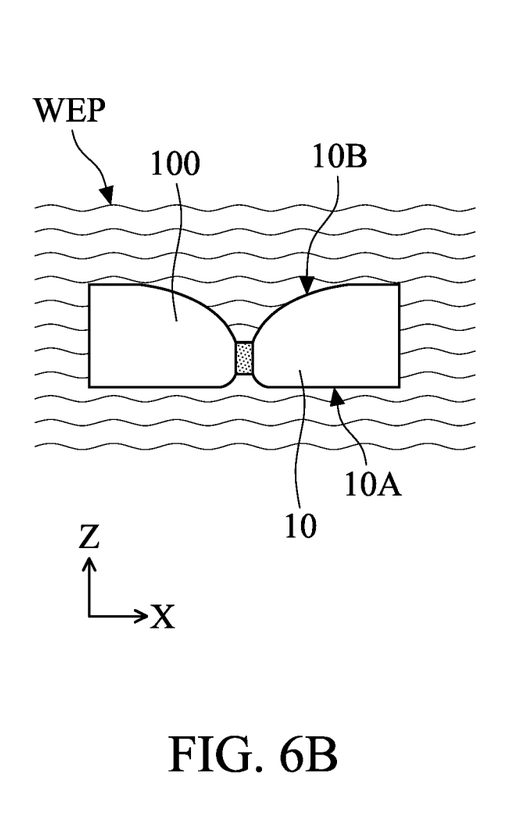
Figure 6C:
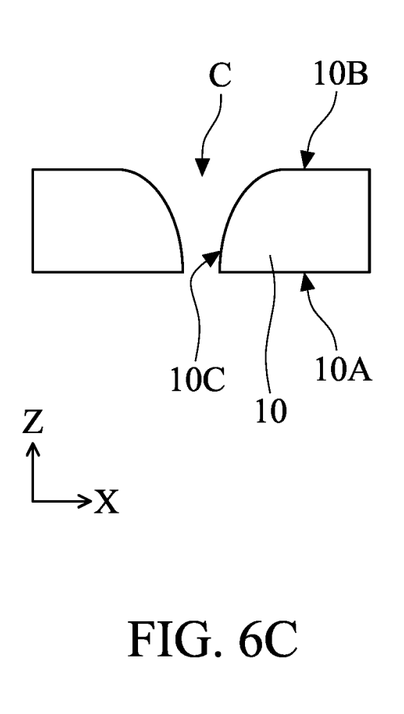

Referring to FIG. 6A to FIG. 6C, which are cross-sectional views of a substrate structure at different formation stages according to another embodiment of the present disclosure. Specifically, in the present embodiment, different steps are used to form arc profiles C with different shapes. As shown in FIG. 6A, in some embodiments, the step of performing the laser process LP on the glass substrate 10 further includes the following operation. Along the thickness direction (that is, Z direction) of the glass substrate 10, the glass substrate 10 is intermittently irradiated with a plurality of first laser light spots LS_1 having a first diameter d1 from the bottom surface 10A of the glass substrate 10 to the top surface 10B of the glass substrate 10 until an intermediate level H.

In some embodiments, the first diameter d1 of the first laser light spots LS_1 may be between 1 μm and 10 μm, and the dot central interval s2 of two adjacent first laser light spots LS_1 may be 1 μm to 10 μm, but the present disclosure is not limited thereto. In some embodiments, the dot central interval s2 may be about ½ of the first diameter d1, or two adjacent first laser light spots LS_1 may be in contact with each other but not overlap. In some embodiments, the vertical distance h1 between the intermediate level H and the bottom surface 10A is ½, ⅓, ¼, or other suitable values, such as ⅓, of the thickness T of the glass substrate 10, but the present disclosure is not limited thereto.

Following the above process, along the thickness direction of the glass substrate 10 (that is, the Z direction), the glass substrate 10 is subsequently intermittently irradiated a plurality of second laser light spots LS_2 having a second diameters d2 from the intermediate level H to the top surface 10B of the glass substrate 10. The second diameter d2 is different from the first diameter d1.

In some embodiments, the second diameter d2 of the second laser light spots LS_2 may be between 2 μm and 20 μm, and the dot central interval s3 of two adjacent second laser light spots LS_2 may be 2 μm to 20 μm, but the present disclosure is not limited thereto. In some embodiments, the dot central interval s3 may be about ½ of the second diameter d2, or two adjacent second laser light spots LS_2 may be in contact with each other but not overlap. In some embodiments, the second diameter d2 may be between 1.5 and 5 times the first diameter d1, such as 2 times, but the present disclosure is not limited thereto.

As shown in FIG. 6B, the modified region 101 formed by the above steps will have different degrees of recessing near the top surface 10B and the bottom surface 10A. Therefore, as shown in FIG. 6C, although the finally formed scribed surface 10C has a circular arc profile C, the circular arc profile C is half bullnose. In other words, the present disclosure may control the shape of the scribed surface 10C according to the parameters of the laser process (for example, diameter), thereby improving the applicability of the product.

Figure 7A:
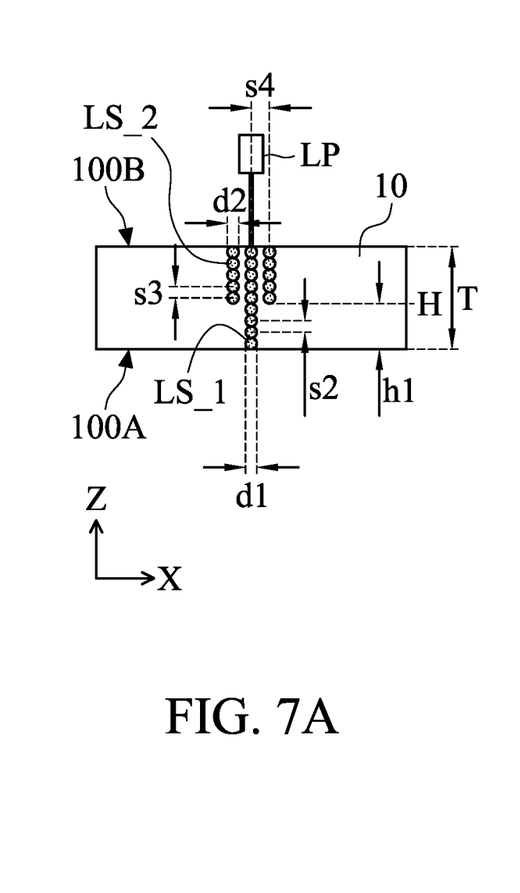
FIGS. 7A to 7C are cross-sectional views illustrating the substrate structure at different formation stages according to another embodiment of the present disclosure.
Figure 7B:
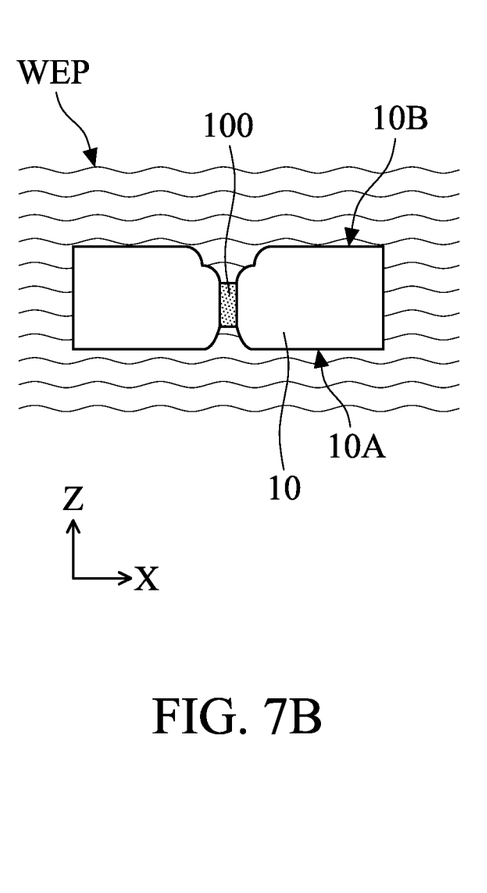
Figure 7C:
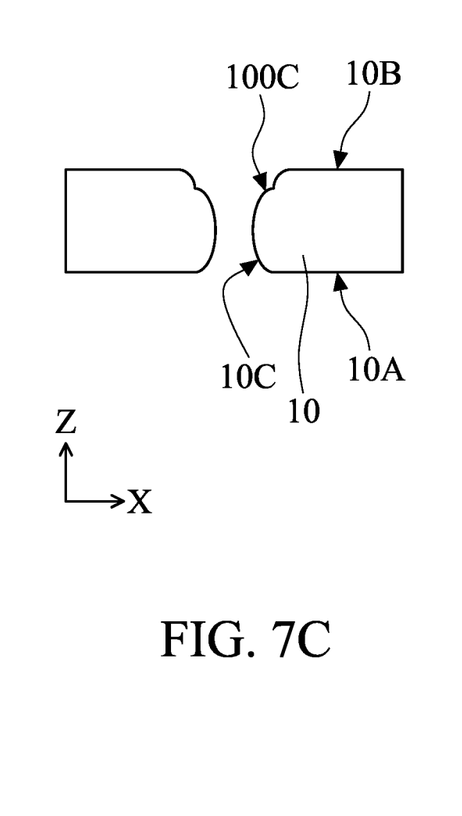

Referring to FIGS. 7A to 7C, which are cross-sectional views of a substrate structure at different formation stages according to another embodiment of the present disclosure. Specifically, in the present embodiment, different steps are used to form the scribed surface 10C with a stepped portion. As shown in FIG. 7A, in some embodiments, the step of performing the laser process LP on the glass substrate 10 further includes the following operation. Along the thickness direction of the glass substrate 10 (that is, the Z direction), the glass substrate 10 is intermittently irradiated a plurality of first laser light spots LS_1 having a first diameter d1 from the bottom surface 10A of the glass substrate 10 to the top surface 10B of the glass substrate 10.

In some embodiments, the first diameter d1 of the first laser light spots LS_1 may be between 1 μm and 10 μm, and the dot central interval s2 of two adjacent first laser light spots LS_1 may be 1 μm to 10 μm, but the present disclosure is not limited thereto. In some embodiments, the dot central interval s2 may be about ½ of the first diameter d1, or two adjacent first laser light spots LS_1 may be in contact with each other but not overlap.

Following the above process, along the thickness direction of the glass substrate 10 (that is, the Z direction), the glass substrate 10 is intermittently irradiated with a plurality of second laser light spots having a second diameter d2 from the intermediate level H to the top surface 10B of the glass substrate 10. The laser light spots LS_2 are located on at least one side or on opposite sides of the plurality of first laser light spots LS_1. In the present embodiment, the plurality of second laser light spots LS_2 are located on opposite sides of the plurality of first laser light spots LS_1 and are symmetrical to each other. In some embodiments, the horizontal dot central interval s4 between the plurality of second laser light spots LS_2 and the plurality of first laser light spots LS_1 may be between 25 μm and 150 μm, but the present disclosure is not limited thereto.

In some embodiments, the second diameter d2 of the second laser light spots LS_2 may be between 1 μm and 10 μm, and the dot central interval s3 between two adjacent second laser light spots LS_2 may be between 1 μm and 10 μm, but the present disclosure is not limited thereto. In some embodiments, the dot central interval s3 may be about ½ of the second diameter d2, or two adjacent second laser light spots LS_2 may be in contact with each other but not overlap. In some embodiments, the second diameter d2 may be similar to or the same with the first diameter d1, but the present disclosure is not limited thereto. In some embodiments, the vertical distance h1 between the intermediate level H and the bottom surface 10A is ½ of the thickness T of the glass substrate, but the present disclosure is not limited thereto.

As shown in FIG. 7B, the modified region 101 formed by the above steps and the surrounding glass substrate 10 may be removed in a large area during the wet etching process. Therefore, as shown in FIG. 7C, the finally formed scribed surface 10C has a stepped portion 100C, and the stepped portion 100C protrudes outward from the middle of the glass substrate 10. In other words, the present disclosure may control the shape of the scribed surface 10C according to the parameters of the laser process (for example, position and quantity), thereby improving the applicability of the product. It should be noted that, by making the plurality of second laser light spots LS_2 on opposite sides of the plurality of first laser light spots LS_1 asymmetrical and/or having different parameters, or applying a plurality of third laser light spots (not shown), more stepped portions 100C or stepped portions 100C with more complicated shapes are formed.

Figure 8A:
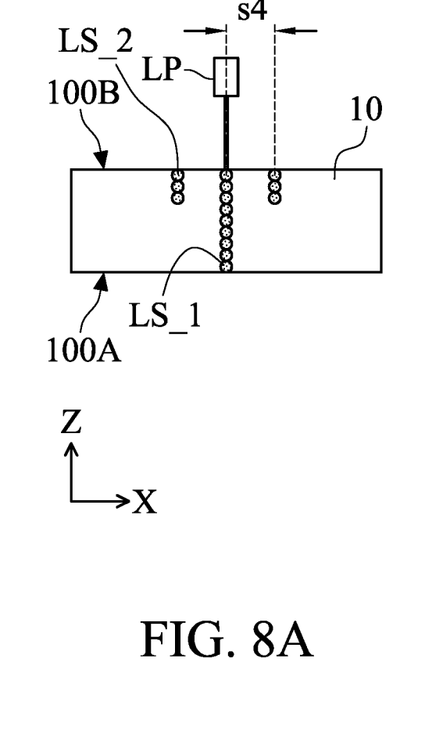
FIGS. 8A to 8C are cross-sectional views illustrating the substrate structure at different formation stages according to another embodiment of the present disclosure.
Figure 8B:
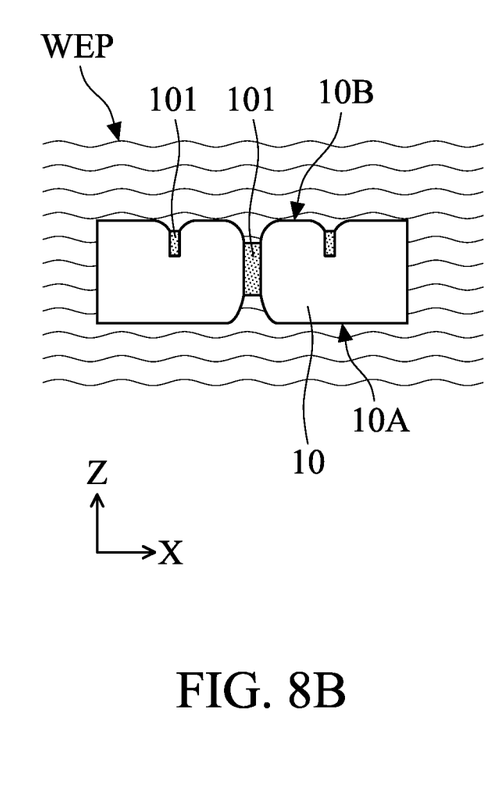
Figure 8C:
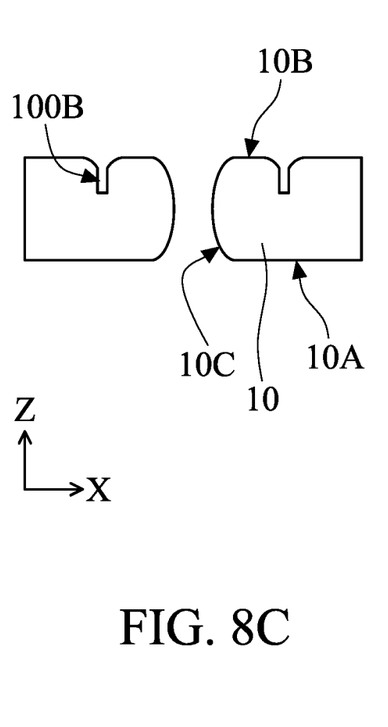

Referring to FIG. 8A to FIG. 8C, which are cross-sectional views of a substrate structure at different formation stages according to another embodiment of the present disclosure. Specifically, in the present embodiment, a notch 100D is formed on at least one side of the scribed surface 10C of the glass substrate 10 through different steps. Compared with the embodiment shown in FIG. 7A to FIG. 7C, the present embodiment may make the horizontal dot central interval s4 far enough, such as between 0.5 mm and 1 mm, to retain the glass substrate 10 between the plurality of second laser light spots LS_2 and the plurality of first laser light spots LS_1 after the wet etching process WEP, so as to form the notch 100B on at least one side of the scribed surface 10C. The notches 100B may be used for products that need to perform a glue coating process on the glass substrate 10 in order to prevent the glue from overflowing to the edge of the glass substrate 10. In some embodiments, the depth of the notch 100B may be ⅓ of the thickness T of the glass substrate 10, but the present disclosure is not limited thereto.

Figure 9A:
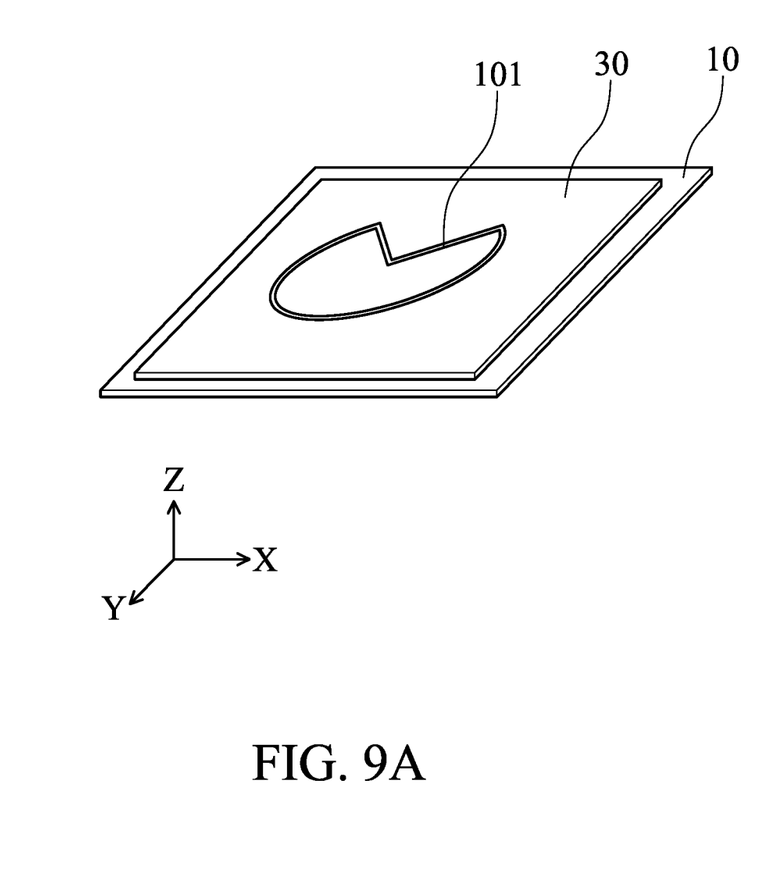
FIGS. 9A and 9B are schematic diagrams illustrating the substrate structure at different formation stages according to another embodiment of the present disclosure.
Figure 9B:
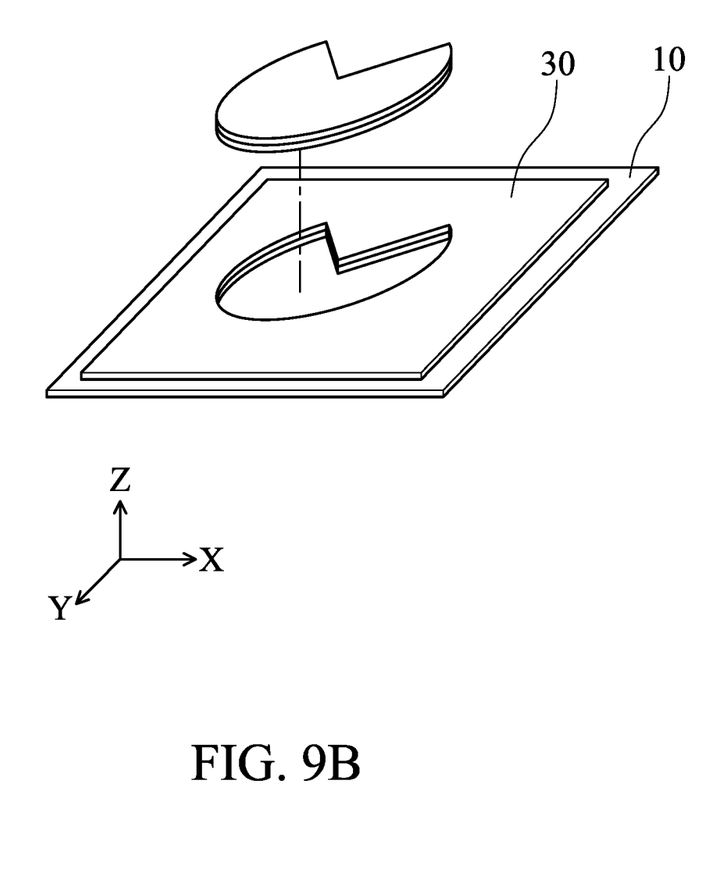

Referring to FIGS. 9A and 9B, which are schematic diagrams of a substrate structure in different formation stages according to another embodiment of the present disclosure. As shown in the figures, although the scribing lines SL are all straight lines and the formed substrate structures are all rectangular, the cutting method for a substrate structure disclosed in the present disclosure may also be applied to special-shaped cutting according to requirements. For example, various shapes of modified regions 101 may be formed by being irradiated with a plurality of laser light spots on the glass substrate 10 along an expected non-linear path. The shape may be a square, a polygon, a rectangle with rounded corners, a circle, an ellipse, a drop shape, an irregular shape, or other suitable shapes, but the present disclosure is not limited thereto. Subsequently, the substrate structure may be cut by using the above-mentioned wet etching process to realize special-shaped cutting.

As mentioned above, the embodiments of the present disclosure provide a substrate structure and a cutting method thereof, which uses a laser process to generate etching selectivity for different regions of the glass substrate, and then cuts the glass substrate through a wet etching process, thereby effectively solving the problem that the existing cutting method is easy to cause damage to the glass substrate. In addition, the scribed surface of the substrate structure cut by the disclosed method has an arc-shaped profile, so that an additional edge grinding process may be omitted to further reduce the manufacturing cost.

Components in the disclosed embodiments may be mixed and matched arbitrarily as long as they do not violate the spirit of the invention or conflict with each other. In addition, the scope of protection of the present disclosure is not limited to the process, machine, manufacture, material composition, device, method and steps in the specific embodiments described in the specification, any person with ordinary knowledge in the field may learn from the contents of the present disclosure Understand the process, machine, manufacture, material composition, device, method and steps developed in the present or in the future, as long as they may implement substantially the same function or obtain substantially the same result in the embodiments described herein, they may be used according to the present disclosure. Therefore, the scope of protection of the present disclosure includes the above-mentioned process, machine, manufacture, composition of matter, device, method and steps. Any embodiment or claims of the present disclosure need not achieve all the objectives, advantages and/or features disclosed in the present disclosure.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same purposes and/or achieving the same advantages of the embodiments introduced herein. A person having ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A cutting method for a substrate structure, comprising:
   providing a first substrate structure, wherein the first substrate structure comprises a glass substrate and a redistribution layer disposed on the glass substrate;

performing a laser process on the glass substrate to form a modified region on the glass substrate, wherein the step of performing the laser process on the glass substrate comprises:
  along a thickness direction of the glass substrate, intermittently irradiating the glass substrate with a plurality of laser light spots having a first diameter from a bottom surface of the glass substrate to a top surface of the glass substrate, wherein a dot central interval of the plurality of laser light spots is about 2/3 of the first diameter; and
performing a wet etching process on the modified region of the glass substrate to remove the modified region and form a plurality of second substrate structures.

2. The cutting method for the substrate structure as claimed in claim 1, wherein the laser process comprises:
  irradiating the glass substrate with picosecond infrared light or femtosecond infrared light to form the modified region.

3. The cutting method for the substrate structure as claimed in claim 1, wherein the laser process comprises:
  along a scribe line of the glass substrate, intermittently irradiating the glass substrate with the plurality of laser light spots having the first diameter.

4. The cutting method for the substrate structure as claimed in claim 1, wherein the wet etching process comprises applying an etchant to the modified region of the glass substrate, wherein the etchant comprises hydrofluoric acid (HF) and/or fluorine amines ($NH_4F$).

5. The cutting method for the substrate structure as claimed in claim 1, wherein
  before performing the laser process on the glass substrate, the cutting method for the substrate structure further comprises disposing a protection layer to cover the glass substrate and the redistribution layer;
  the step of performing the laser process on the glass substrate further comprises removing a part of the protection layer in the laser process to expose a part of the glass substrate, and forming the modified region on the part of the glass substrate; and
  after performing the wet etching process on the modified region of the glass substrate, the cutting method for the substrate structure further comprises removing the protection layer.

6. A cutting method for a substrate structure, comprising:
providing a first substrate structure, wherein the first substrate structure comprises a glass substrate and a redistribution layer disposed on the glass substrate;
performing a laser process on the glass substrate to form a modified region on the glass substrate, wherein the step of performing the laser process on the glass substrate comprises:
  along a thickness direction of the glass substrate, intermittently irradiating the glass substrate with a plurality of first laser light spots having a first diameter from a bottom surface of the glass substrate toward a top surface of the glass substrate until an intermediate level; and
  then along the thickness direction of the glass substrate, intermittently irradiating the glass substrate with a plurality of second laser light spots having a second diameter from the intermediate level to the top surface of the glass substrate, wherein the second diameter is different from the first diameter; and
performing a wet etching process on the modified region of the glass substrate to remove the modified region and form a plurality of second substrate structures.

7. The cutting method for the substrate structure as claimed in claim 6, wherein a vertical distance between the intermediate level and the bottom surface is 1/3 of a thickness of the glass substrate.

8. The cutting method for the substrate structure as claimed in claim 6, wherein the first diameter is 1/2 of the second diameter.

9. The cutting method for the substrate structure as claimed in claim 6, wherein
  a dot central interval of the first laser light spots is about 2/3 of the first diameter; and/or
  a dot central interval of the second laser light spots is about 1/2 of the second diameter.

10. A cutting method for a substrate structure, comprising:
providing a first substrate structure, wherein the first substrate structure comprises a glass substrate and a redistribution layer disposed on the glass substrate;
performing a laser process on the glass substrate to form a modified region on the glass substrate, wherein the step of performing the laser process on the glass substrate comprises:
  along a thickness direction of the glass substrate, intermittently irradiating the glass substrate with a plurality of first laser light spots having a first diameter from a bottom surface of the glass substrate toward a top surface of the glass substrate; and
  along the thickness direction of the glass substrate, intermittently irradiating the glass substrate with a plurality of second laser light spots having a second diameter from an intermediate level of the glass substrate to the top surface of the glass substrate, wherein the second laser light spots are located on at least one side of the first laser light spots; and
performing a wet etching process on the modified region of the glass substrate to remove the modified region and form a plurality of second substrate structures.

11. The cutting method for the substrate structure as claimed in claim 10, wherein a vertical distance between the intermediate level and the bottom surface is 1/2 of a thickness of the glass substrate.

12. The cutting method for the substrate structure as claimed in claim 10, wherein the first diameter is the same as the second diameter.

13. The cutting method for the substrate structure as claimed in claim 10, wherein the second laser light spots are located on opposite sides of the first laser light spots.

* * * * *